United States Patent [19]

Finegan et al.

[11] Patent Number: 4,492,852

[45] Date of Patent: Jan. 8, 1985

[54] GROWTH SUBSTRATE HEATING ARRANGEMENT FOR UHV SILICON MBE

[75] Inventors: Sean N. Finegan, Aberdeen; James H. McFee, East Windsor; Robert G. Swartz, Highlands, all of N.J.

[73] Assignee: AT&T Bell Laboratories, Murray Hill, N.J.

[21] Appl. No.: 465,800

[22] Filed: Feb. 11, 1983

[51] Int. Cl.³ .................... H05B 1/00; H01L 21/20
[52] U.S. Cl. .................... 219/405; 118/725; 219/411; 219/354
[58] Field of Search ............ 219/275, 271, 354, 347, 219/405, 411; 118/725, 50.1, 620, 728, 724

[56] References Cited

U.S. PATENT DOCUMENTS 3,536,892  10/1970  Walther ........................ 219/405
3,842,794  10/1974  Ing ............................. 118/724
4,101,759   7/1978  Anthony ....................... 219/405

FOREIGN PATENT DOCUMENTS 54-111771  9/1979  Japan ........................... 118/724

OTHER PUBLICATIONS

"Alloying Ohmic Contacts . . . ", W. Walter, IBM Tech. Disc. Bull., vol. 14, No. 6, Nov. 1971, p. 1940.
Becker, G. E., "Acceptor Dopants in Silicon M.B.E.", Journal of Applied Physics, vol. 48, No. 8, Aug. 1977, pp. 3395–3399.
Ota, Y., "Si Molecular Beam Epitaxy . . . ", J. Electrochem. Soc.: Solid-State Science and Tech., Nov. 1977, vol. 124, No. 11, pp. 1795–1802.
Ota, Y., "Silicon Molecular Beam Epitaxy . . . ", J. Appl. Phys., 51(2), Feb. 1980, pp. 1102–1110.
Tabe, M., "Effect of Growth Temperature on Si MBE Film", Japanese Journal of Applied Physics, vol. 20, No. 4, Apr. 1981, pp. 703–708.
Sugiura, H., "Growth of Dislocation-Free . . . ", J. Vac. Sci. Technology 19(2), Jul./Aug. 1981, pp. 157–160.
Tabe, M., "Etching of $SiO_2$ Films by Si . . . ", Jap. J. Appl. Phys., vol. 21, No. 3, Mar. 1982, pp. 534–538.

Primary Examiner—Clifford C. Shaw
Assistant Examiner—Teresa J. Walberg
Attorney, Agent, or Firm—Gregory C. Ranieri

[57] ABSTRACT

A substrate heating arrangement suitable for use in ultra-high vacuum MBE includes a filament responsive to a DC current for generating thermal energy, a metallic enclosure surrounding the filament and having an aperture at one end thereof, an intermediate semiconductor substrate parallel to and separated from a semiconductor growth substrate, and a substrate support mounted to the enclosure capable of holding the substrates in the prescribed relationship.

The intermediate semiconductor substrate regulates the temperature on the surface of the semiconductor growth substrate to be less than or equal to a fixed temperature (approximately 1100° C. for silicon) regardless of the DC current applied to the filament.

6 Claims, 4 Drawing Figures

GROWTH SUBSTRATE HEATING ARRANGEMENT FOR UHV SILICON MBE

TECHNICAL FIELD

This invention relates to molecular beam deposition under ultra-high vacuum conditions and, more particularly, to temperature regulated heating of a silicon (Si) growth substrate.

BACKGROUND OF THE INVENTION

Molecular beam epitaxy (MBE) is a term used to denote the epitaxial growth of semiconductor films by a process involving the reaction of one or more thermal molecular beams with a crystalline surface under ultra-high vacuum conditions. Use of shutter mechanisms and relatively slow growth rates (e.g., 1 $\mu$m/hr.) allow rapid changing of beam species and growth of layers as thin as a monolayer.

In addition, since electrically active impurities are added to the growing film by means of separate beams, the doping profile normal to the surface can be varied and controlled with a spatial resolution difficult to achieve by more conventional, faster growth techniques such as CVD and LPE.

MBE has been used to fabricate films of a variety of material from elemental materials such as Si to Group III-V compounds as well as Group II-VI and Group IV-VI materials. Silicon MBE is related to Group III-V MBE in terms of the equipment and processes used for epitaxial growth. It differs profoundly, however, in other aspects such as growth temperature, defect structures, device applications, and in the type and quality of competing epitaxial growth techniques.

In most silicon MBE arrangements, silicon growth substrate heaters are relatively simple structures employing direct ohmic heating of the substrate. The growth substrate in this type of arrangement is clamped at opposite ends and a voltage is applied thereto. To achieve uniform heating of the substrate, growth substrate geometries have been modified to be rectangular. Also the growth substrate is often heavily doped to minimize the voltage required for initial heating. In practice, however, uniform heating does not occur because each clamp holding the growth substrate tends to act as a heat sink thereby cooling each end of the growth substrate. Moreover, a non-uniform current results within the substrate because electrical contact is made at only one location for each clamp.

It is an object of the present invention to provide reproducible, uniform heating of silicon growth substrates, regardless of geometry, to temperatures required for epitaxial growth in an ultra-high vacuum environment.

It is a further object of the present invention to provide the appropriate temperature environment which will yield high quality, low defect density epitaxially grown material suitable for subsequent integrated circuit fabrication.

SUMMARY OF THE INVENTION

Uniform and reproducible heating for silicon growth substrates over the temperature range required for high quality, low defect density epitaxial growth in an ultra-high vacuum environment is ensured in accordance with an aspect of the present invention by applying a predetermined current to a filament for radiating energy having a first set of spectral components from the filament, absorbing at least a portion of the radiated energy in an intermediate substrate, and radiating energy having a second set of spectral components from the intermediate substrate.

In one embodiment, the substrate heating arrangement suitable for use in ultra-high vacuum MBE includes a filament responsive to a DC current for generating thermal energy, a metallic enclosure surrounding the filament and having an aperture at one end thereof, an intermediate semiconductor substrate parallel to and separated from a semiconductor growth substrate, and a substrate support mounted to the enclosure capable of holding the substrates in the prescribed relationship.

BRIEF DESCRIPTION OF THE DRAWINGS

A more complete understanding of the invention may be obtained by reading the following description of a specific illustrative embodiment of the invention in conjunction with the appended drawings in which.

DETAILED DESCRIPTION

An embodiment of the growth substrate heating arrangement is shown in the Figures. Particularly, the arrangement shown for purposes of illustration and not for the purpose of limitation is used for epitaxial growth on 2 inch diameter silicon substrates or wafers. It will be obvious to those skilled in the art after reading the following description that this arrangement is capable of being modified to accept other round silicon substrates or rectangular substrates or the like.

The substrate heating arrangement is adapted for use in ultra-high vacuum silicon MBE systems and, specifically, in an evacuable growth or deposition chamber thereof. Silicon MBE systems have been described and shown in the following technical articles: G. E. Becker et al., *J. Appl. Phys.*, Vol. 48, No. 8, p. 3395; Y. Ota, *J. Electrochem. Soc.*, Vol. 124, No. 11, p. 1797 and *J. Appl. Phys.*, Vol. 51, No. 2, p. 1102; M. Tabe et al., *Jap. J. Appl. Phys.*, Vol. 20, No. 4, p. 703; and M. Tabe, *Jap. J. Appl. Phys.*, Vol. 21, No. 3, p. 534. The growth substrate heating arrangement shown in FIGS. 1 and 2 is located in the evacuable growth chamber facing an electron beam silicon evaporation source.

Figure 1:
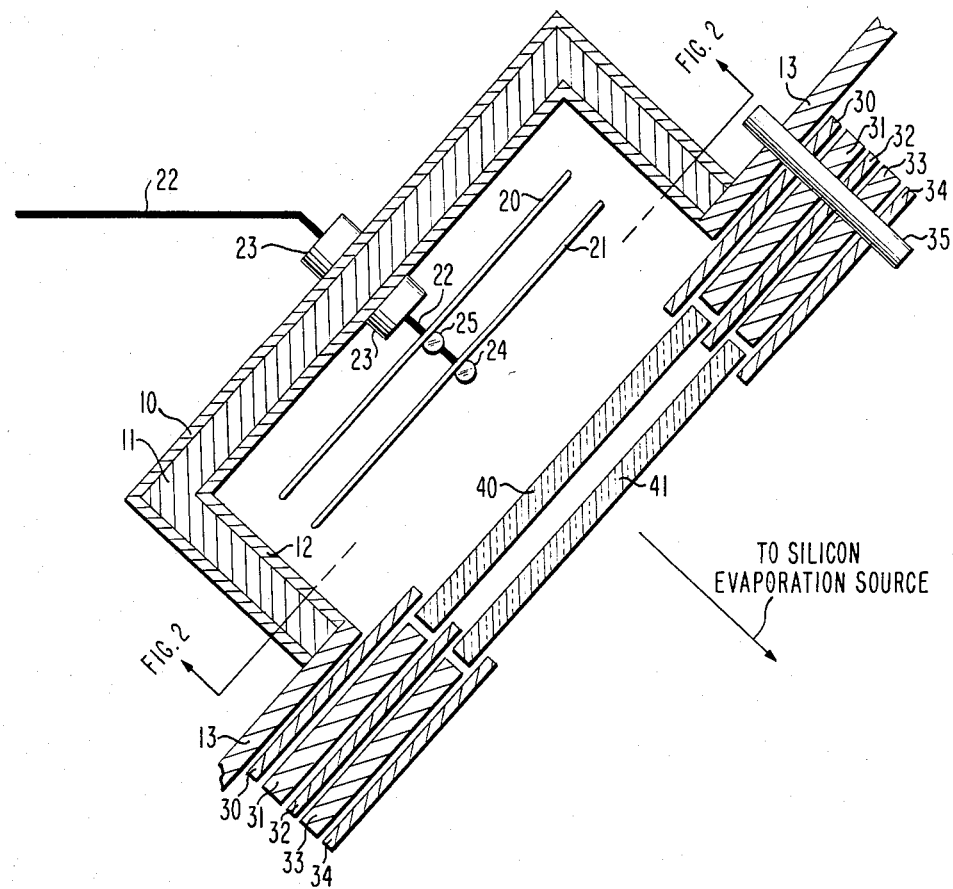
FIG. 1 illustrates, in cross-section, a growth substrate heating arrangement embodying the principles of the invention and adapted for use in round wafer silicon MBE.
Figure 2:
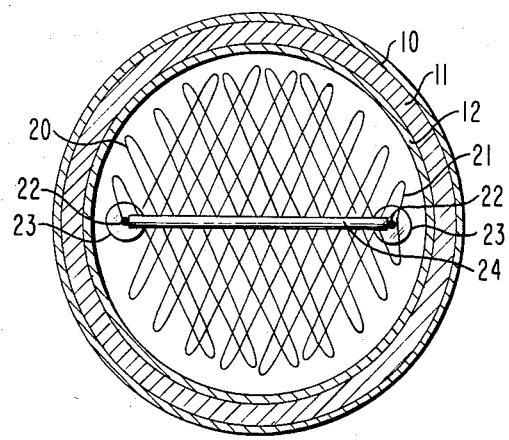
FIG. 2 depicts the heater filament and associated apparatus viewed from section line 2—2 in FIG. 1.

With reference to both FIGS. 1 and 2, the growth substrate heating arrangement is comprised of an oven section, a substrate support section, and a substrates section. Each section is described below in more detail.

The oven section is comprised of a heat source and a heat source container which includes outer oven shell 10, radiation shield 11, inner oven shell 12 and faceplate 13. Outer oven shell 10 and inner oven shell 12 are cylindrical metallic enclosures having an aperture at only one end. Radiation shield 11 provides a metallic insulation layer between inner oven shell 12 and outer oven shell 10. Faceplate 13 is a structural support element upon which the substrate support section is mounted. For the arrangement in FIG. 1, faceplate 13 includes an opening of approximately the same size and shape as the open end of inner oven shell 12. Thin wall metal construction is utilized for the oven section to ensure structural rigidity and minimum heat mass. In the example, tantalum was used for inner oven shell 12, radiation shield 11, and outer oven shell 10 and molybdenum was used for faceplate 13. An exemplary inner diameter and inner depth for shell 12 is approximately 5.7 cm and 1.9 cm, respectively.

The heat source includes filaments 20 and 21, conductors 22, insulators 23, and filament supports 24 and 25. Insulators 23 are both spaced apart and located in the closed end of oven shells 10 and 12 in order to provide an insulating conduit for both conductors 22 through outer oven shell 10, radiation shield 11 and inner oven shell 12. Conductors 22 are rigid or semirigid metallic element which pass through vias of insulators 23 into the cylindrical cavity created by inner oven shell 12. The two conductors 22 are spaced apart and supply electrical current to and provide end support for filaments 20 and 21. Filaments 20 and 21 are mounted onto conductors 22, substantially parallel to each other and spaced apart by a small distance (<1 cm). Each filament is arranged into a predetermined shape which establishes a wide area heating pattern for the substrates. As shown in FIG. 2, a meandering, serpentine geometry is employed for each filament. Filaments 20 and 21 are supported respectively by filament supports 25 and 24 in order to inhibit sagging of the filaments. Filament supports 24 and 25 are each rod-like insulators which span the distance between both conductors 22. In practice, the insulating elements in the heat source can be composed of pyrolitic boron nitride while the current conducting element can be composed of tantalum. Each conductor is adapted to carry at least 15 ampere direct current.

FIG. 2 shows a view of the oven section from section line 2—2 in FIG. 1.

In FIG. 1, the substrate support section is comprised of a plurality of rings which hold the substrates in proper position with respect to each other and the oven section. Rings 30, 31 and 32 support intermediate substrate 40 and create a substantially enclosed region within which substrate 40 sits. Rings 32, 33 and 34 support growth substrate 41 and create a substantially enclosed region within which substrate 41 sits. Ring 32 also provides proper spacing between intermediate substrate 40 and growth substrate 41. The inner diameter of ring 31 is slightly larger than the diameter of substrate 40 in order to allow for free radial thermal expansion during substrate heating. A similar relationship exists between the corresponding diameters of ring 33 and substrate 41. Only one post 35 has been shown, but several posts 35 are disposed inside the circumference of the stack of rings 30 through 34, for example, with 120 degree spacings between posts. In practice, the rings and posts have been fabricated from tantalum.

The substrate section includes intermediate substrate 40 and growth substrate 41. Intermediate substrate 40 is parallel to and separated from growth substrate 41 and is interposed between filaments 20 and 21 and substrate 41. A separation of 200 to 500 μm has been employed between substrates 40 and 41. While growth substrate 41 is comprised of silicon, it is preferred that intermediate substrate 40 be substantially identical to substrate 41 in composition and size. Intermediate substrate 40 provides a uniform distribution of thermal energy from filament 20 and 21 to growth substrate 41 and also blocks impurity outgassing from within the oven enclosure.

Figure 3:
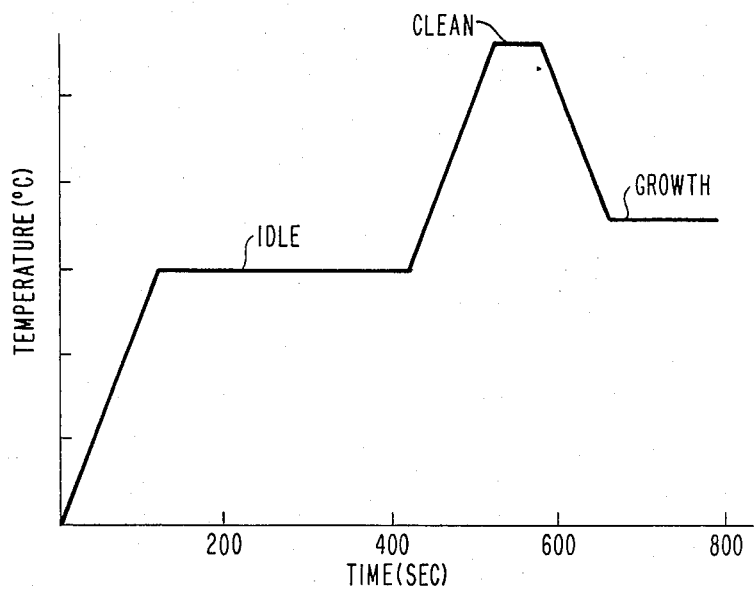
FIG. 3 shows a general temperature vs. time curve for a silicon MBE growth process.

FIG. 3 illustrates a typical temperature versus time graph for silicon MBE processing of a 2 inch silicon substrate. Substrate 41 is initially heated to a low "idling" temperature (>400 degrees C.) where substrate 41 and surroundings are allowed to come to thermal equilibrium. Cleaning occurs when the temperature is rapidly raised over 900 degrees C. at which point a thin silicon dioxide layer is desorbed. The silicon dioxide layer had been grown on the surface of growth substrate 41 prior to its insertion in the evacuable growth chamber in order to form a barrier between the silicon surface and any sources of contamination. Substrate 41 is maintained at this "clean" temperature for approximately 60 to 120 seconds, and is then cooled to the temperature at which epitaxial growth is to take place—typically 600–800 degrees C. It should be noted that the times and temperatures described in relation to FIG. 3 are exemplary.

After the growth chamber has been evacuated to $10^{-8}$–$10^{-9}$ Torr, substrate heating is initiated by applying a predetermined current to filaments 24 and 25 in order to cause thermal energy to be radiated therefrom. The spectrum of this thermal energy possesses a first set of components and varies as a function of temperature. At low temperatures, most energy emitted from the continuous tantalum filaments is in the infrared regions. Silicon is substantially transparent to infrared radiation, but a small portion of the filament radiation is absorbed by each substrate. The substrates, in response to the absorbed radiation, emit thermal energy having a set of spectral components different from the first set.

As filament temperature is increased by adjusting the current to the filaments, filament emissions shift toward the visible region of the spectrum while substrate absorption shifts toward the infrared region. As a result, there is a threshold filament current beyond which the silicon intermediate substrate absorbs substantially all thermal energy radiated from the filaments. Re-emission of this absorbed energy by the intermediate substrate in a uniformly distributed pattern heats the growth substrate.

Figure 4:
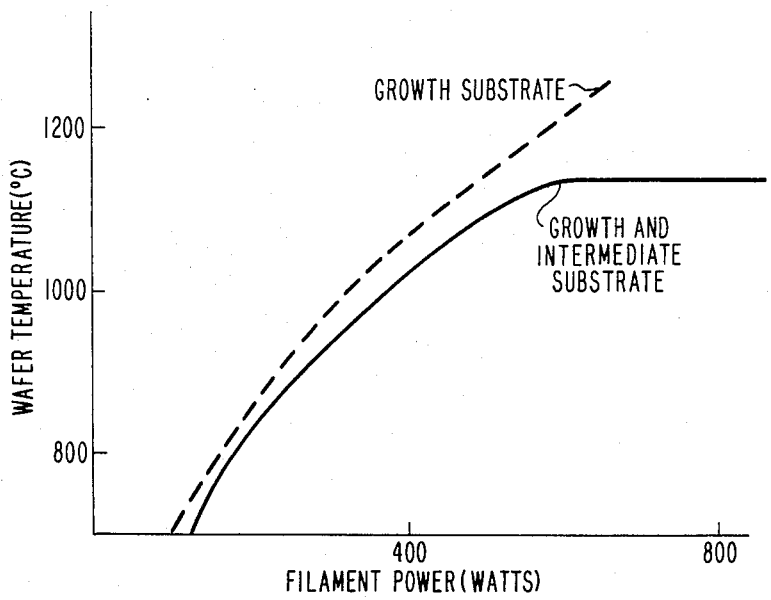
FIG. 4 shows a plot of growth substrate temperature vs. filament power as a function of the presence or absence of the intermediate substrate.

After the growth substrate has been heated uniformly to a temperature exceeding 1000 degrees C., further filament temperature increases are regulated by the intermediate substrate to inhibit further increases in the growth substrate temperature. This regulation function is apparent from the curves shown in FIG. 4, where growth substrate surface temperature is plotted versus filament power. As shown, the presence of the intermediate substrate causes regulation of growth substrate temperature for increasing filament power, whereas no temperature regulation occurs in the absence of the intermediate substrate. The temperature at which regulation occurs is well within the range necessary to carry out the step of cleaning (900 degrees C. to 1200 degrees C.).

The growth substrate heating arrangement described above yields high crystalline quality, low defect density epitaxial layers. Typical epitaxial line dislocation density is less than $10^3$/cm$^2$ and is largely determined by the dislocation density of the starting silicon growth substrates. Local dislocation density is less than $10^4$/cm$^2$.

What is claimed is:

1. In an evacuable chamber adapted for use in a molecular beam epitaxy system, a substrate heating arrangement including filament means responsive to an applied current for generating thermal energy, container means for forming an enclosure around said filament means, said container means including an aperture on at least one surface, first and second semiconductor substrates, said first semiconductor substrate regulating the temperature on the surface of said second semiconductor substrate to be not greater than a predetermined temperature for any current applied to said filament means, siad second semiconductor substrate being a growth substrate, and substrate support means for holding said first and second substrates in a substantially parallel, spaced-apart relationship with respect to each other, said substrate support means being mounted to said container means at said aperture.

2. The arrangement as defined in claim 1 wherein the filament means includes first and second filaments being parallel to and spaced apart from each other, and conductor means connected in circuit with the first and second filament for applying a current thereto.

3. The arrangement as defined in claim 1 wherein at least said first semiconductor substrate is comprised of silicon and is interposed between said filament means and said second semiconductor substrate.

4. A method of heating a semiconductor growth substrate in an evacuable chamber of a molecular beam epitaxy system, the method including the steps of, applying a current to a metallic filament for radiating thermal energy having a first set of spectral components, absorbing at least a portion of the radiated thermal energy in an intermediate semiconductor substrate located between the metallic filament and the semiconductor growth substrate, radiating thermal energy having a second set of spectral components from the intermediate semiconductor substrate in a uniformly distributed pattern, and regulating the temperature on a surface of the semiconductor growth substrate via the intermediate semiconductor substrate so that said temperature is not greater than a predetermined temperature for any current applied to the metallic filament.

5. The method as defined in claim 4 wherein the step of applying the current includes applying the current to first and second metallic filaments separated from and parallel to each other.

6. The method as defined in claim 4 wherein the intermediate semiconductor substrate is comprised of silicon.

* * * * *